United States Patent
Kaldewey et al.

(10) Patent No.: US 10,606,840 B2
(45) Date of Patent: Mar. 31, 2020

(54) PARALLEL LEMPEL-ZIV DECOMPRESSION FOR HIGHLY-PARALLEL COMPUTER ARCHITECTURES

(71) Applicant: INTERNATIONAL BUSINESS MACHINES CORPORATION, Armonk, NY (US)

(72) Inventors: Tim Kaldewey, Philadelphia, PA (US); Rene Mueller, San Jose, CA (US); Evangelia Sitaridi, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 319 days.

(21) Appl. No.: 15/431,642

(22) Filed: Feb. 13, 2017

(65) Prior Publication Data
US 2018/0232420 A1    Aug. 16, 2018

(51) Int. Cl.
*H03M 7/30* (2006.01)
*G06F 16/2455* (2019.01)
*G06F 16/22* (2019.01)

(52) U.S. Cl.
CPC .... *G06F 16/24561* (2019.01); *G06F 16/2237* (2019.01); *H03M 7/3084* (2013.01)

(58) Field of Classification Search
CPC . H03M 7/3084; H03M 7/3086; H03M 7/3088
See application file for complete search history.

(56) References Cited

U.S. PATENT DOCUMENTS

| | | | |
|---|---|---|---|
| 5,179,378 A | 1/1993 | Ranganathan et al. | |
| 6,693,567 B2 | 2/2004 | Cockburn et al. | |
| 6,819,271 B2 | 11/2004 | Geiger et al. | |
| 7,817,069 B2 | 10/2010 | Schneider | |
| 8,106,799 B1 | 1/2012 | Yang et al. | |
| 8,156,364 B2 | 4/2012 | Ratakonda et al. | |
| 8,279,096 B2 | 10/2012 | Novy | |
| 9,484,954 B1* | 11/2016 | Gopal | H03M 7/4037 |
| 9,753,666 B2 | 9/2017 | Gopal et al. | |
| 9,967,368 B2 | 5/2018 | Fallon et al. | |
| 2015/0381203 A1* | 12/2015 | Master | G06F 16/24561 341/67 |
| 2016/0233880 A1* | 8/2016 | Mizushima | H03M 7/3086 |
| 2017/0103085 A1* | 4/2017 | Kataoka | G09C 1/00 |

OTHER PUBLICATIONS

List of IBM Patents or Applications Treated as Related.
(Continued)

*Primary Examiner* — Chuong D Ngo
(74) *Attorney, Agent, or Firm* — Sherman IP LLP; Kenneth L. Sherman; Hemavathy Perumal

(57) ABSTRACT

One embodiment provides a method comprising receiving a plurality of encoded and compressed data blocks, decoding the data blocks, and decompressing the data blocks utilizing a plurality of processor sets. Each processor set is assigned a data block to decompress. The processor sets decompress in parallel to exploit inter-block parallelism. Each processor set comprises one or more processors that collaborate in decompressing an assigned data block to exploit intra-block parallelism. The method further comprises generating a final uncompressed output sequence based on uncompressed data blocks resulting from the decompressing.

20 Claims, 9 Drawing Sheets

(56) References Cited

OTHER PUBLICATIONS

Chlopkowski, M. et al., "A General Purpose Lossless Data Compression Method for GPU", Journal of Parallel and Distributed Computing, Jan. 2015, pp. 40-52, vol. 75, Issue C, United States.

Tan, L.S. et al., "Optimizing LZW Text Compression Algorithm via Multithreading Programming", Proceedings of the 2009 IEEE 9th Malaysia International Conference on Communications, Dec. 15-17, 2009, pp. 592-596, IEEE, United States.

Mehboob, R. et al., "High Speed Lossless Data Compression Architecture", Proceedings of the 2006 Multitopic Conference (INMIC'06), Dec. 23-24, 2006, pp. 84-88, IEEE, United States.

Shun, J. et al.. "Practical Parallel Lempel-Ziv Factorization", Proceedings of the 2013 Data Compression Conference (DCC'13), Mar. 20, 2013, pp. 123-132. IEEE Computer Society, United States.

Ziv, J., "A Universal Algorithm for Sequential Data Compression", Proceedings of the IEEE Transactions on Information Theory, May 1977, pp. 337-343, vol. IT-23, No. 3, IEEE, United States.

List of IBM Patents or Applications Treated as Related; Kaldeway, T., U.S. Appl. No. 16/428,754, filed May 31, 2019.

\* cited by examiner

PARALLEL LEMPEL-ZIV DECOMPRESSION FOR HIGHLY-PARALLEL COMPUTER ARCHITECTURES

The present invention generally relates to data compression, and more particularly, to a parallel Lempel-Ziv data decompression scheme for highly-parallel computer architectures.

BACKGROUND

A highly-parallel computer architecture has a larger processor count as it comprises a large number of processor devices. Examples of highly-parallel computer architectures include multi-core processor systems such as, but are not limited to, Graphics Processor devices (GPUs), Field-Programmable Gate-Arrays (FPGAs), Massively-Parallel Processor Arrays (MPPAs), etc. Conventional data compression algorithms that are inherently sequential in nature do not effectively exploit the high degree of parallelism that highly-parallel computer architectures provide.

SUMMARY

One embodiment provides a method comprising receiving a plurality of encoded and compressed data blocks, decoding the data blocks, and decompressing the data blocks utilizing a plurality of processor sets. Each processor set is assigned a data block to decompress. The processor sets decompress in parallel to exploit inter-block parallelism. Each processor set comprises one or more processors that collaborate in decompressing an assigned data block to exploit intra-block parallelism. The method further comprises generating a final uncompressed output sequence based on uncompressed data blocks resulting from the decompressing.

These and other aspects, features and advantages of the invention will be understood with reference to the drawing figures, and detailed description herein, and will be realized by means of the various elements and combinations particularly pointed out in the appended claims. It is to be understood that both the foregoing general description and the following brief description of the drawings and detailed description of the invention are exemplary and explanatory of preferred embodiments of the invention, and are not restrictive of the invention, as claimed.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

The present invention generally relates to data compression, and more particularly, to a parallel Lempel-Ziv data decompression scheme for highly-parallel computer architectures. One embodiment provides a method comprising receiving a plurality of encoded and compressed data blocks, decoding the data blocks, and decompressing the data blocks utilizing a plurality of processor sets. Each processor set is assigned a data block to decompress. The processor sets decompress in parallel to exploit inter-block parallelism. Each processor set comprises one or more processors that collaborate in decompressing an assigned data block to exploit intra-block parallelism. The method further comprises generating a final uncompressed output sequence based on uncompressed data blocks resulting from the decompressing.

LZ77 compression scheme is a lossless data compression algorithm described in the publication titled "A universal algorithm for sequential data compression" by Abraham Lempel and Jacob Ziv, published in *IEEE Transactions on Information Theory* in 1977. The LZ77 compression scheme is a dictionary encoding technique that achieves data compression by replacing repeated occurrences of data (e.g., a string of symbols) within an input data stream with references to a single copy of that data existing earlier in the input data stream (e.g., a reference to a dictionary location of the same string occurring earlier in the input data stream). During a matching phase of the algorithm, a match is encoded by a pair of numbers denoted as a length-distance pair. The length-distance pair indicates that each of the next length characters is equal to the characters positioned exactly distance characters behind it in the input data stream (i.e., distance is indicative of offset). The Lempel-Ziv-Storer-Szymanski (LZSS) compression scheme is a derivative of LZSS.

Conventionally, to parallelize compression on multi-core and many-core systems, an input data stream is divided into multiple data blocks that are processed independently and in parallel by multiple processor cores. In order to utilize the large number of processor cores available, the input data stream is split into many data blocks. The resulting processed data blocks, however, may be too small, leading to a lower compression ratio as there is less redundancy to exploit within each data block. This conventional solution exploits only inter-block parallelism and is unsuitable for highly-parallel computer architectures such as GPUs, FPGAs, or MPPAs.

For expository purposes, the term "processor" as used herein generally refers to a processor device, a specialized processor device (e.g., an application acceleration processor such as a GPU, a FPGA, etc.), a hardware thread, or a processor core of a multi-core or many-core system.

Figure 1C:
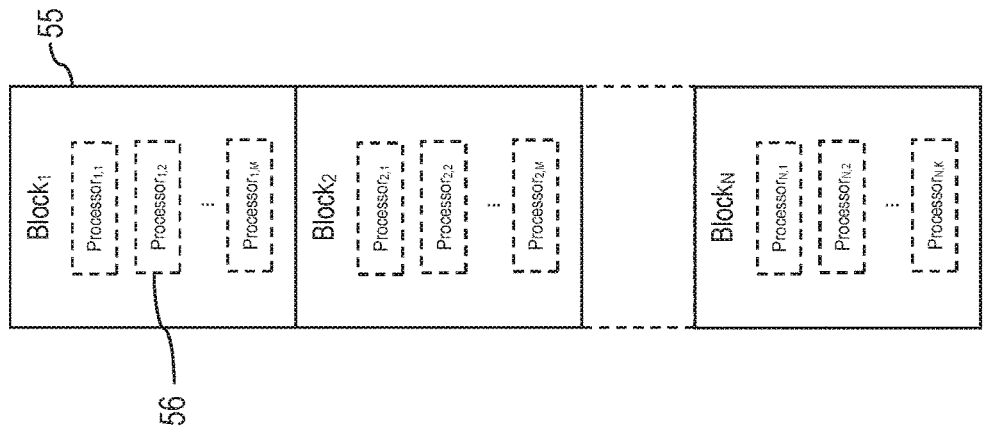
FIG. 1C illustrates an example data compression scheme that exploits both intra-block parallelism and inter-block parallelism, in accordance with an embodiment of the invention.
Figure 1B:
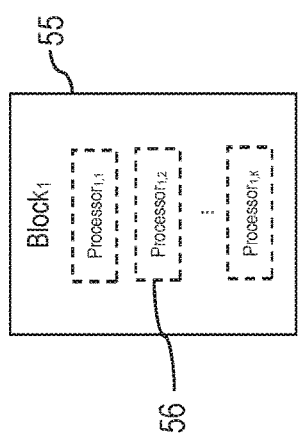
FIG. 1B illustrates an example data compression scheme that exploits only intra-block parallelism.
Figure 1A:
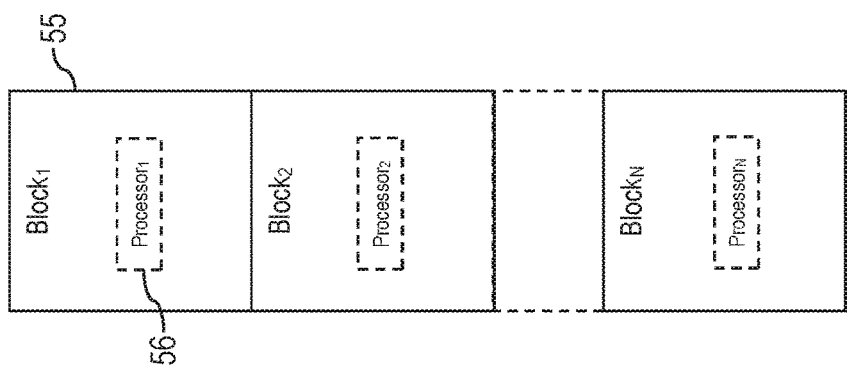
FIG. 1A illustrates an example data compression scheme that exploits only inter-block parallelism.

FIG. 1A illustrates an example data compression scheme that exploits only inter-block parallelism. In inter-block parallelism, multiple data blocks 55 are processed independently and in parallel. Specifically, each data block 55 has a corresponding processor 56 for processing the data block 55 (e.g., $Processor_1$ processing $Block_1$, $Processor_2$ processing $Block_2$, . . . , and finally, $Processor_N$ processing $Block_N$).

FIG. 1B illustrates an example data compression scheme that exploits only intra-block parallelism. In intra-block parallelism, multiple processors 56 cooperatively process a data block 55 in parallel (e.g., $Processor_{1,1}$, $Processor_{1,2}$, . . . , $Processor_{1,K}$ cooperatively processing $Block_1$).

FIG. 1C illustrates an example data compression scheme that exploits both intra-block parallelism and inter-block parallelism, in accordance with an embodiment of the invention. In one embodiment, multiple data blocks 55 are processed independently and in parallel. Specifically, collaborating groups of processors are assigned to work on the same data block 55. Each data block 55 has a corresponding set of processors 56 that cooperatively process the data block 55 in parallel (e.g., $Processor_{1,1}$, $Processor_{1,2}$, . . . , $Processor_{1,M}$ cooperatively processing $Block_1$, whereas $Processor_{2,1}$, $Processor_{2,2}$, . . . , $Processor_{2,M}$ cooperatively processing $Block_2$, . . . , and finally, $Processor_{N,1}$, $Processor_{N,2}$, . . . , $Processor_{N,M}$ cooperatively processing $Block_N$).

Figure 2:
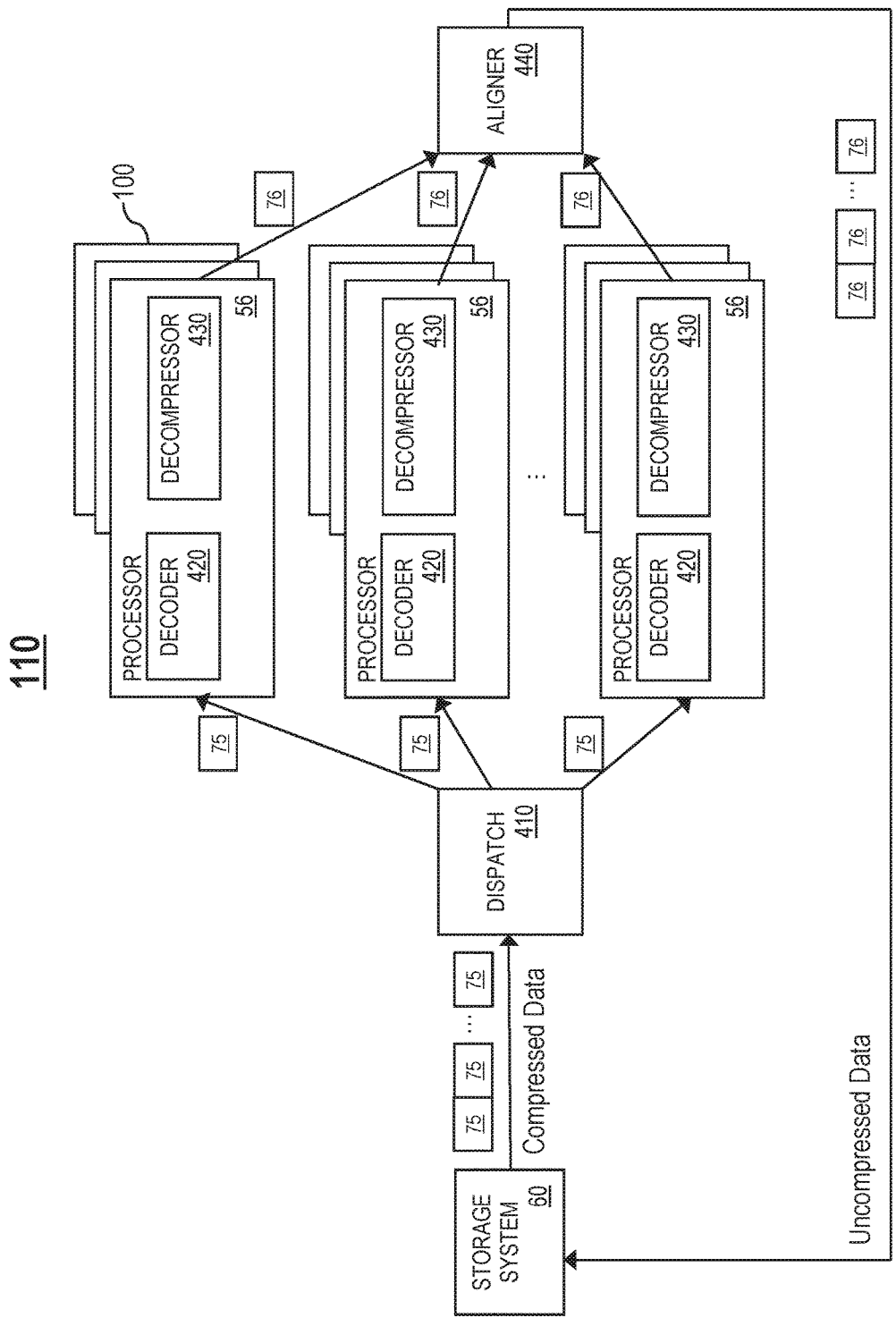
FIG. 2 illustrates an example highly-parallel decompression system, in accordance with an embodiment of the invention.

FIG. 2 illustrates an example highly-parallel decompression system 110, in accordance with an embodiment of the invention. As described in detail later herein, the decompression system 110 implements a parallel Lempel-Ziv data decompression scheme utilizing multiple different processor sets 100, wherein each processor set 100 comprises one or more processors 56.

The decompression system 110 further comprises a dispatch unit 410 configured to: (1) receive, in response to a read request, a sequence 74 of encoded and compressed data blocks 75 requested from a storage system 60, (2) dequeue compressed data blocks 75 from the sequence 74, and (3) dispatch each compressed data block 75 to one of the processor sets 100.

In one embodiment, the storage system 60 exchanges data with the decompression system 110 over a connection (e.g., a wireless connection, a wired connection, or a combination of the two). The storage system 60 may comprise a single persistent storage device or a distribution of persistent storage devices.

Each compressed data block 75 is first decoded (i.e., to undo the entropy coding) into a decoded data block 76 that is then decompressed (i.e., to undo the LZ-style compression). In one embodiment, the decompression system 110 further comprises one or more decoder units 420 (e.g., a Huffman, an arithmetic, or a range entropy decoder) configured to decode the compressed data blocks 75 into decoded data blocks 76.

After decoding, the decoded data blocks 76 are decompressed independently and in parallel. The decompression system 110 exploits both intra-block parallelism and inter-block parallelism during parallel decompression. To exploit inter-block parallelism, the different processor sets 100 decompress different data blocks in parallel. To exploit intra-block parallelism, processors 56 of each processor set 100 collaborate in decompressing a given data block. Specifically, each processor set 100 comprises y processors 56 that cooperatively decompress a given data block, wherein y≥1. The processor sets 100 utilize file offsets included in block headers 70 (FIG. 3) of the data blocks to facilitate parallel decompression.

In one embodiment, the decompression system 110 further comprises multiple decompressors 430 that operate in parallel (i.e., run concurrently). Each processor set 100 utilizes a decompressor 430 to decompress a given data block. In one embodiment, the decompressors 430 are assigned to different processor sets 100. In another embodiment, each decompressor 430 is in instantiated separately in silicon. Each decompressor 430 uses parallelism (e.g., thread parallelism by having multiple processors 56 or hardware threads collaborating on decompression of a data block, or using pipeline parallelism and task parallelism for an embodiment in silicon or an FPGA).

The decompression system 110 further comprises an aligner unit 440 configured to: (1) receive resulting uncompressed data blocks 77 from the decompressors 430, and (2) assemble the uncompressed data blocks 77 that arrive out of order (as some later dispatched uncompressed data blocks 75 may be faster to decompress than some earlier dispatched compressed data blocks 75). A stream of uncompressed data with block boundaries removed is formed from the assembled uncompressed data blocks 77. The stream of uncompressed data may be written to the storage system 60.

Except for the last compressed data block 75 of the sequence 74, the compressed data blocks 75 are equal-sized (i.e., have the same size). As such, for each resulting uncompressed data block 77, a corresponding start position of the resulting uncompressed data block 77 in a final uncompressed output sequence may be easily determined. A corresponding start position of a resulting uncompressed data block 77 represents a position of a first byte of the uncompressed data block 77 in the final uncompressed output sequence.

Let B denote a size of an uncompressed data block 77 in bytes, wherein, with the exception of a last uncompressed data block 77 in the final uncompressed output sequence, B is a constant for all resulting uncompressed data blocks 77. The last uncompressed data block 77 may have fewer bytes than B if a total length of the final uncompressed output sequence is not an integer multiple of B. Let i denote a block identification (ID) for an uncompressed data block 77 in the final uncompressed output sequence. Assume an index for both a block ID i and a start position are initialized to 1 (i.e., first elements are at position 1). For each resulting uncompressed data block 77 with block ID i, a corresponding start position of the resulting uncompressed data block 77 in the final uncompressed output sequence is $(i-1) \cdot B + 1$.

To exploit intra-block parallelism during parallel decompression, the parallel decompression for each decoded data block 76 is based on multiple parallel prefix scan passes. Such operations may be available in the form of library primitives on multiple platforms, or may be implemented directly using hardware primitives (e.g., the warp-shuffle instructions on GPUs). A study of parallel prefix scan passes as a functional primitive is available in the publication titled "Scans as Primitive Parallel Operations" by G. E. Blelloch, published in *IEEE Transactions on Computers* in November 1989.

Let P denote a processor set 100 assigned to a given data block, let $P_{num}$ denote a number of processors 56 included in the processor set P, and let $P_k$ denote a processor 56 of the processor set P, wherein $P_{num} \geq 1$, and wherein $P = \{P_1, \ldots, P_{num}\}$.

In one embodiment, each decoder unit 420 is further configured to factorize a string of characters or bytes included in a given data block into a sequence of decoded tokens ("decoded token sequence"). Let S denote a decoded token sequence for a string of characters or bytes included in a data block, let $S_{size}$ denote a total number of tokens in the decoded token sequence S, and let $S_a$ denote a token at position a in the decoded token sequence S. Each token $S_a$ may be either a literal token x or a back-reference token (o, l), wherein the literal token x represents a particular character or byte of the string, and wherein the back-reference token (o, l) contains two numbers that refer to the substring that starts at the $o^{th}$ character or byte of the string and includes the next l characters or bytes of the string. If $S_{size} > P_{num}$, ceil($S_{size}/P_{num}$) repetitions of the entire algorithm is performed.

Literal tokens and back-reference tokens are typically encoded and decoded separately. In one embodiment, a decoded token sequence S may be represented as a list of literal tokens ("literal list") V, a list of back-reference tokens ("back-ref list") B, and a bitmap of back-reference tokens ("back-ref bitmap") T. A back-ref bitmap T comprises a sequence of bits. Let $t_k$ denote a bit at position k in the back-ref bitmap T, and let $T_{size}$ denote a size of the back-ref bitmap T, wherein $T_{size} = S_{size}$. In one embodiment, a bit $t_k$ is set (e.g., $t_k=1$) if a corresponding token $S_a$ in the decoded token sequence S is a back-reference token. A bit $t_k$ is cleared (e.g., $t_k=0$) if a corresponding token $S_a$ in the decoded token sequence S is a literal token.

Each processor $P_k$ of a processor set P is assigned a token $S_a$ in a decoded token sequence S for a given data block (e.g., the processor $P_1$ is assigned a first token $S_1$ to process, the processor $P_2$ is assigned a second token $S_2$ to process, etc.). To determine whether the assigned token $S_a$ is a literal token or a back-reference token, the processor $P_k$ checks a bit $t_k$ in the back-ref bitmap T. If the bit $t_k$ is set (e.g., $t_k=1$), the processor $P_k$ processes a back-reference token; otherwise, the processor $P_k$ processes a literal token.

The processors $P_1, \ldots, P_{min}$ collectively compute two inclusive prefix-scans (i.e., two inclusive prefix sums), once using bits of the back-ref bitmap T, and another using bits of the negated back-ref bitmap T'. Let $x_k$ denote a prefix sum for a bit tk in the back-ref bitmap T at a processor $P_k$. Let $x_k$ denote a prefix sum for a bit $t_k'$ in the negated back-ref bitmap T' at a processor $P_k$. If a bit $t_k$ is set, a processor $P_k$ uses a prefix sum $x_k$ as an index into the back-ref list B to retrieve an assigned back-reference token; otherwise, the processor $P_k$ uses the prefix sum $x_k$ as an index into the literal list V to retrieve a literal value v for an assigned literal token.

Let L denote a list of token length values ("token lengths list"), and let $l_k$ denote a length value of the token lengths list L. Each length value $l_k$ is equal to a length of the substring in characters or bytes in the uncompressed output sequence that corresponds to a token $S_a$ assigned to a processor $P_k$.

Let E denote an output array representing an uncompressed output sequence for a data block, and let $E_j$ denote an element of the uncompressed output sequence E. Assume j is initialized to 1 (i.e., a first element of the uncompressed output sequence E starts/begins at index position 1).

Each processor $P_k$ assigned a back-reference token determines each of the following: (1) a corresponding length $l_k$ of a subsequence (i.e., substring) the processor $P_k$ copies and writes to the uncompressed output sequence E, and (2) a corresponding destination index range $[d_l, d_u]$ in the uncompressed output sequence E the subsequence is written into, wherein $d_u - d_l + 1 = l_k$. By contrast, each processor $P_k$ assigned a literal token writes a corresponding literal value for the literal token into a single position in the uncompressed output sequence (i.e., $d_l = d_u$).

If a processor $P_k$ determines that an assigned token $S_a$ is a literal token, $l_k = 1$. If a processor $P_k$ determines that an assigned token $S_a$ is a back-reference token, a length value $l_k$ is extracted from the back-reference token $S_a = (o_k, l_k)$.

The processors $P_1, \ldots, P_{num}$ collectively compute an exclusive prefix-scan (i.e., an exclusive prefix sum). Each processor $P_k$ computes an exclusive prefix sum that is exclusive of a length value $l_k$ of an assigned token $S_a$, wherein the exclusive prefix sum corresponds to a zero-indexed lower position of an index range in the uncompressed output sequence E the processor $P_k$ writes into. As the first element of the uncompressed output sequence E starts/begins at index position 1, the value of 1 is added to the exclusive prefix sum.

Each processor $P_k$ assigned a back-reference token computes a corresponding source index range $[s_l, s_u]$ in the uncompressed output sequence E. Each processor $P_k$ assigned either a back-reference token or a literal token computes a corresponding destination index range $[d_l, d_u]$ in the uncompressed output sequence E, wherein $d_l = d_u$ if the processor $P_k$ is assigned a literal token. At this point, each processor $P_k$ knows where in the uncompressed output sequence E the processor $P_k$ must write an assigned token to.

Let c denote a binary vector of length $P_{num}$, and let $c_k$ denote a bit of the binary vector c. Each bit $c_k$ represents a flag for a corresponding processor $P_k$; the bit $c_k$ is set if the processor $P_k$ has completed writing an assigned token to the uncompressed output sequence E.

Literal values are written into the uncompressed output sequence E first. Each processor $P_k$ assigned a literal token writes a corresponding literal value v for the literal token at a corresponding start position $d_u$ in the uncompressed output sequence E. After the processor $P_k$ has finished writing the literal value v, a corresponding flag $c_k$ is set.

Let $(o_k, l_k)$ denote a dependent back-reference token. A dependent back-reference token $(o_k, l_k)$ refers to a substring in an uncompressed output sequence E that is produced by another back-reference token (i.e., at least one element in the interval $[o_k, o_k + l_k - 1]$ of the output sequence E is produced by another back-reference token).

After each literal value for each literal token has been written into the uncompressed output sequence E, the processors $P_1, \ldots, P_{num}$ enter a collaborative process to iteratively resolve any remaining dependent back-reference token. As described in detail later herein, dependencies among back-reference tokens may need to be resolved before all back-reference tokens can be written into the uncompressed output sequence E.

Figure 3:
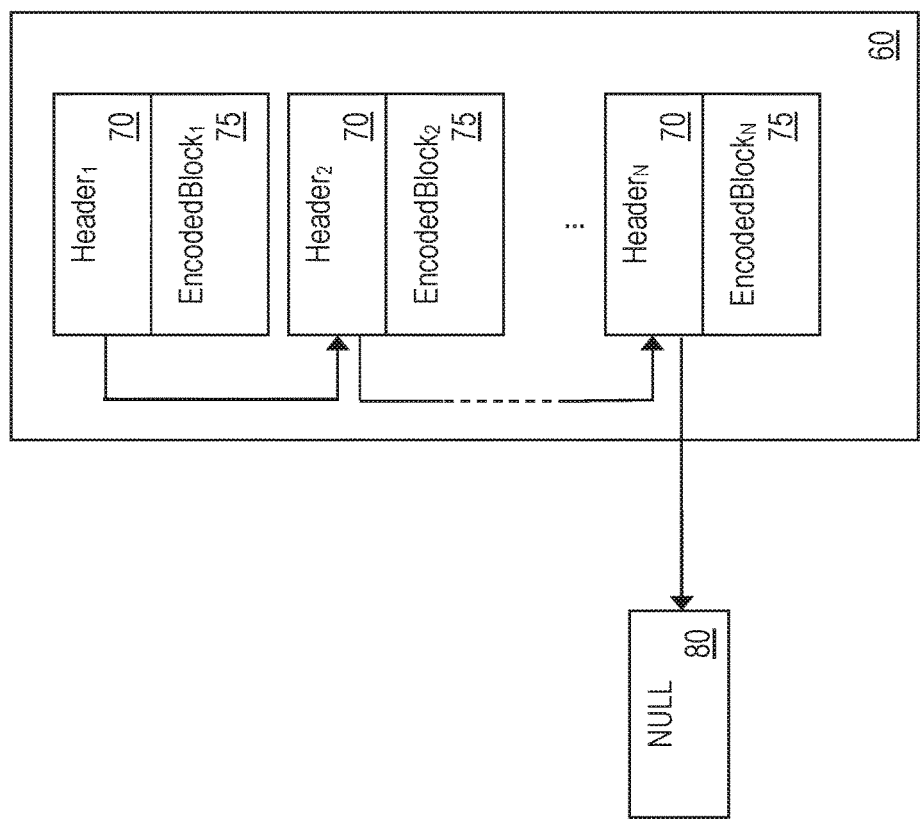
FIG. 3 illustrates an example arrangement of encoded and compressed data blocks written to the storage system, in accordance with an embodiment of the invention.

FIG. 3 illustrates an example arrangement of encoded and compressed data blocks 75 written to the storage system 60, in accordance with an embodiment of the invention. In one embodiment, the data blocks 75 are laid out in the storage system 60 in an arrangement/sequence where each data block 75 is preceded by a corresponding block header 70. A block header 70 comprises information indicative of a file offset (in bytes) to either another block header 70 (i.e., start of subsequent data block 75) or the value NULL 80 if there are no more data blocks in this arrangement/sequence.

For example, as shown in FIG. 3, a first data block 75 (EncodedBlock$_1$) has a first block header 70 (Header$_1$), a second data block 75 (EncodedBlock$_2$) has a second block header 70 (Header$_2$), . . . , and a N$^{th}$ data block 75 (EncodedBlock$_N$) has a N$^{th}$ block header 70 (Header$_N$). The first block header 70 (Header$_1$) references/points to the second block header 70 (Header$_2$). As the N$^{th}$ data block 75 (EncodedBlock$_N$) is the last data block 75 of the arrangement/sequence, the N$^{th}$ block header 70 (Header$_N$) is set to the NULL value 80.

Figure 4:
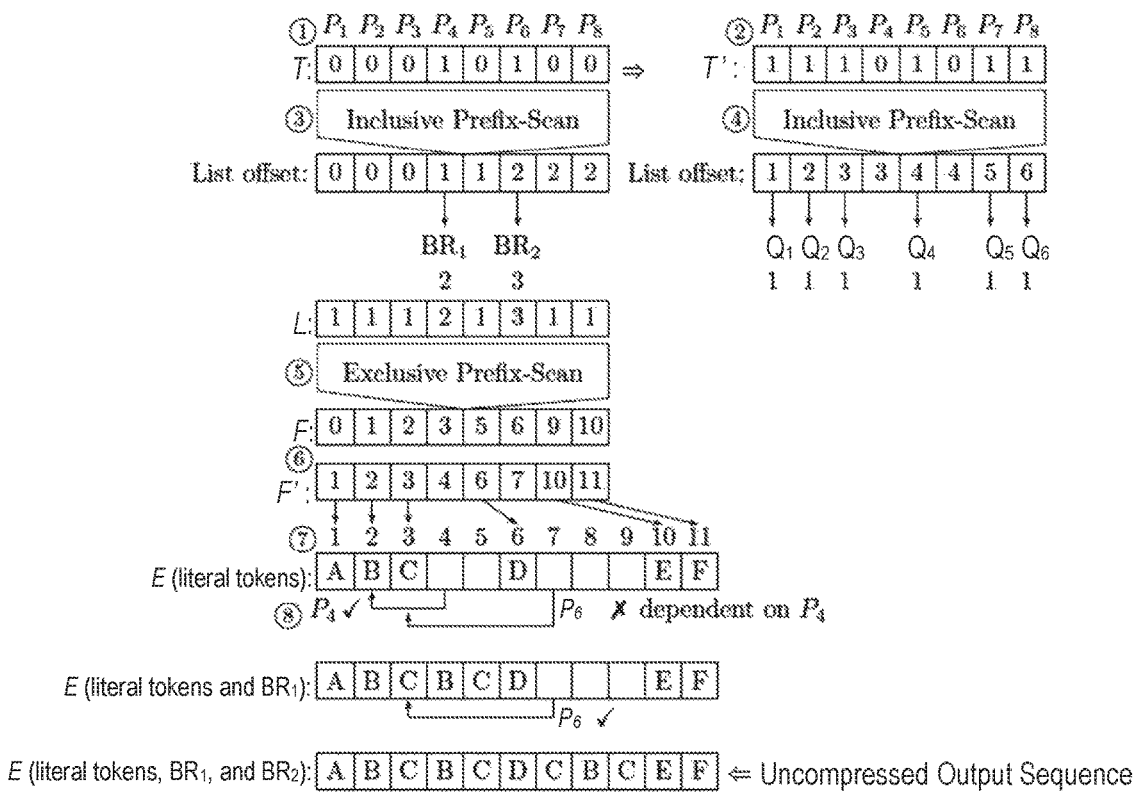
FIG. 4 illustrates an example parallel decompression process performed by the compression system, in accordance with an embodiment of the invention.

FIG. 4 illustrates an example parallel decompression process performed by the decompression system 110, in accordance with an embodiment of the invention. For a data block, assume P$_{num}$=8, such that the data block is assigned processors P$_1$, . . . , P$_8$. As shown in FIG. 4, assume a decoded token sequence S for the data block comprises the following order of tokens: <A>, <B>, <C>, (−2, 2), <D>, (−4, 3), <E>, and <F>. The total number of tokens in the decoded token sequence S is 8 (i.e., S$_{size}$=8). Tokens S$_1$, S$_2$, S$_3$, S$_5$, S$_7$, and S$_8$ (i.e., <A>, <B>, <C>, <D>, <E>, and <F>) are literal tokens, whereas tokens S$_4$ and S$_6$ (i.e., (−2, 2) and (−4, 3)) are back-reference tokens.

As shown in FIG. 4, the processors P$_4$ and P$_6$ are the only processors assigned a back-reference token. Specifically, the processors P$_4$ and P$_6$ are assigned back-reference tokens BR$_1$ and BR$_2$, respectively, wherein BR$_1$=(−2, 2), and BR$_2$=(−4, 3). Further, the processors P$_1$, P$_2$, P$_3$, P$_5$, P$_7$, and P$_8$ are assigned literal tokens Q$_1$, Q$_2$, Q$_3$, Q$_4$, Q$_5$, and Q$_6$, respectively, wherein Q$_1$=<A>, Q$_2$=<B>, Q$_3$=<C>, Q$_4$=<D>, Q$_5$=<E>, and Q$_6$=<F>.

As shown in FIG. 4, T=00010100, wherein T$_{size}$=8, and wherein bits t$_4$ and t$_6$ are set as tokens S$_4$ and S$_6$ are back-reference tokens.

In step 1, each processor P$_k$ is assigned a token S$_a$ in the decoded token sequence S. As shown in FIG. 4, each processor P$_1$, . . . , P$_8$ processes a single token S$_1$, . . . , S$_8$, respectively. Each processor P$_k$ determines whether an assigned token S$_a$ is a back-reference token or a literal token based on a bit tk in the back-ref bitmap T. If the bit t$_k$ is set (e.g., t$_k$=1), the processor P$_k$ processes a back-reference token; otherwise, the processor P$_k$ processes a literal token.

In step 2, the processors P$_1$, . . . , P$_8$ create a negated back-ref bitmap T'. Specifically, each processor P$_k$ negates a bit t$_k$ in the back-ref bitmap T. Let t$_k$' denote a bit at position kin the negated back-ref bitmap T'. As shown in FIG. 4, T'=11101011.

As shown in FIG. 4, the parallel decompression for the data block is based on multiple parallel prefix scan passes. Both bitmaps T and T' are used by each processor P$_k$ to compute two inclusive prefix scans. Specifically, in step 3, each processor P$_k$ assigned a back-reference token determines a corresponding offset for the assigned back-reference token in the back-ref list B using a prefix sum computed from the back-ref bitmap T In step 4, each processor P$_k$ assigned a literal token determines a corresponding literal value for the assigned literal token using a prefix sum computed from the negated back-ref bitmap T'. As shown in FIG. 4, at the end of steps 3 and 4, L=[1,1, 1, 2, 1, 3, 1, 1].

After each processor P$_k$ has the length of an assigned token S$_a$ (i.e., the number of characters or bytes it has to write to the uncompressed output sequence for the assigned token S$_a$), the processors P$_1$, . . . , P$_8$ determine an offset position in the uncompressed output sequence E for the data block that the processors P$_1$, . . . , P$_8$ will write the content corresponding to the tokens S$_1$, . . . , S$_8$. Specifically, in step 5, each processor P$_k$ determines a corresponding start position in the uncompressed output sequence E by computing a parallel exclusive prefix-scan over the token lengths list L.

Let F denote a list of file offsets ("file offsets"), and let F$_k$ denote an offset at position k in the file offsets F. Each offset F$_k$ denotes a corresponding start position in the uncompressed output sequence E at which processor P$_k$ writes the content of token S$_a$. As shown in FIG. 4, at the end of step 5, F=[0, 1, 2, 3, 5, 6, 9, 10].

As a first element of the uncompressed output sequence E starts/begins at index position 1, in step 6, a value of 1 is added to each offset F$_k$ in the file offsets F, resulting in a list of incremented file offsets ("incremented file offsets") F'. Let F$_k$' denote an incremented offset at position kin the incremented file offsets F'. Each incremented offset F$_k$' denotes a corresponding start position in the uncompressed output sequence E for a processor P$_k$. As shown in FIG. 4, at the end of step 6, F'=[1, 2, 3, 4, 6, 7, 10, 11].

In step 7, each processor P$_k$ assigned a literal token writes a corresponding literal value v for the literal token at a corresponding start position F$_k$' in the uncompressed output sequence E. After the processor P$_k$ has finished writing the literal value v, a corresponding flag c$_k$ is set.

In step 8, after each literal value has been written, dependent back-reference tokens are resolved, if any. For example, as shown in FIG. 4, the processor P$_4$ may directly resolve its assigned back-reference token BR$_1$ as all source data is already available. Specifically, the processor P$_4$ copies a subsequence (i.e., substring) from a source index range [2, 3] in the uncompressed output sequence E (i.e., subsequence "BC") to a destination index range [4, 5] in the uncompressed output sequence E. The assigned back-reference token BR$_2$ for the processor P$_6$, however, is a dependent back-reference token. The processor P$_6$ cannot proceed until after the processor P$_4$ has written its assigned back-reference token BR$_1$ in the uncompressed output sequence E as a source index range [3, 5] in the uncompressed output sequence E is not completely available (i.e., still being written by the processor P$_4$). After the processor P$_4$ has written its assigned back-reference token BR$_1$ in the uncompressed output sequence E, the processor P$_6$ may now directly resolve its assigned back-reference token BR$_2$ as all source data is now available. Specifically, the processor P$_6$ copies a subsequence from the source index range [3, 5] in the uncompressed output sequence E (i.e., subsequence "CBC") to a destination index range [7, 9] in the uncompressed output sequence E.

As shown in FIG. 4, at the end of step 8, the uncompressed output sequence E is complete (i.e., comprises each literal token and each back-reference token), wherein E=[A, B, C, B, C, D, C, B, C, E, F].

In one embodiment, to resolve dependent back-reference tokens, a processor P$_k$ may call a routine for parallel resolution of dependent back-reference tokens. When the processor P$_k$ invokes the routine, the processor P$_k$ has determined whether an assigned token is a literal token or a back-reference token. Specifically, if the assigned token is a literal token, the processor P$_k$ has determined each of the following: (1) a corresponding literal value v, and (2) a corresponding start position d$_u$ in the uncompressed output sequence E the processor P$_k$ begins writing to. If the assigned token is a back-reference token, the processor P$_k$ has determined each of the following: (1) a corresponding source range [s$_l$, s$_u$] in the uncompressed output sequence E to copy a subsequence (i.e., substring) from, and (2) a corresponding destination range [d$_l$, d$_u$] in the uncompressed output sequence E to write the copied subsequence to.

In one embodiment, the processors P$_1$, . . . , P$_{num}$ utilize the following two communication primitives during the routine for parallel resolution of dependent back-reference tokens: ballot voting and broadcast. Both primitives are synchronization barriers that may be available either as hardware primitives or as library primitives on a highly-parallel computer architecture. For example, on NVIDIA GPUs, the ballot voting primitive may be available through the vote.ballot instruction, and the broadcast primitive may be available through the shfl.idx instruction.

Figure 5:
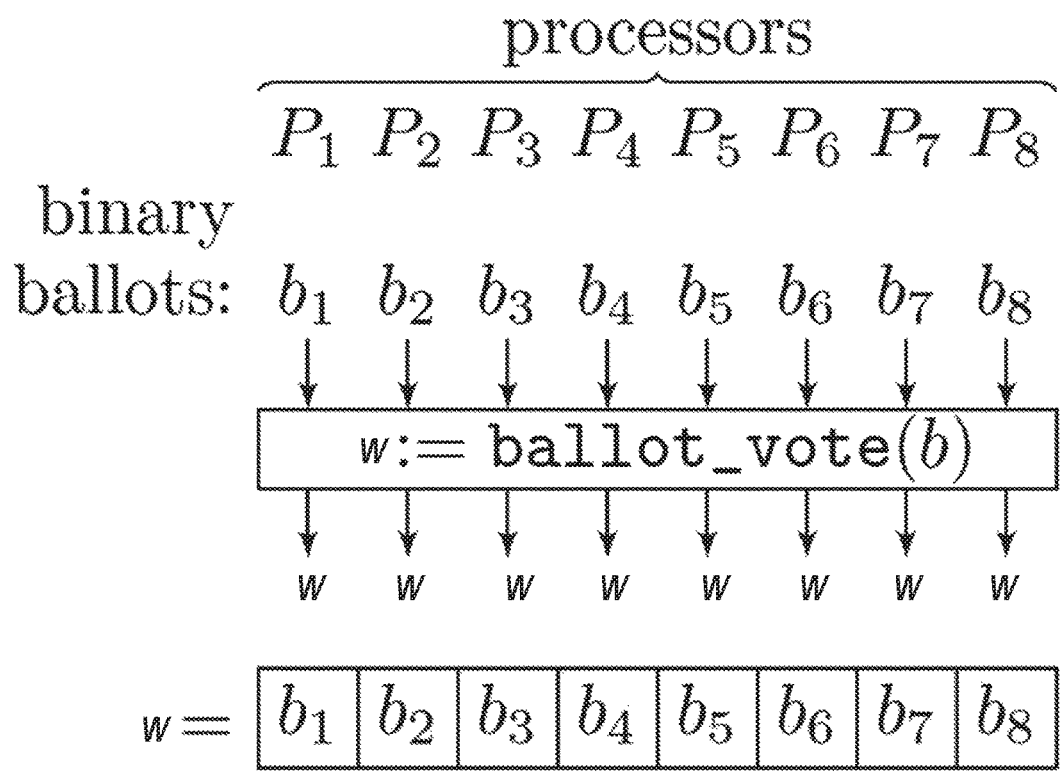
FIG. 5 illustrates an example processor set utilizing a ballot voting primitive, in accordance with an embodiment of the invention.

FIG. 5 illustrates an example set P of processors utilizing a ballot voting primitive, in accordance with an embodiment of the invention. For a data block, assume $P_{num}=8$, such that the data block is assigned processors $P_1, \ldots, P_8$. Each processor $P_k$ votes with a corresponding individual binary ballot $b_k$. Each processor $P_k$ supplies its binary ballot $b_k$ to the ballot voting primitive. Let w denote a binary vector of length $P_{num}$, and let $w_k$ denote a bit at position k in the binary vector w. Each bit $w_k$ is set based on a binary ballot $b_k$ cast by a corresponding processor $P_k$. After all $P_{num}$ processors cast their ballot, the ballot voting primitive provides each processor the resulting binary vector w that contains the individual binary ballots.

The ballet voting primitive serves two functions. First, the ballet voting primitive acts as a barrier to the processors (i.e., it does not permit any processor to continue with its execution until all other processors have reached this barrier). Second, the ballet voting primitive aggregates the individual ballots to one single binary vector and makes the vector w available to all processors.

In one embodiment, the processors $P_1, \ldots, P_{num}$ utilize the ballot voting primitive and the binary vector c to determine whether each processor $P_k$ has completed writing an assigned token into the uncompressed output sequence E. The routine for parallel resolution of dependent back-reference tokens ends when each bit $c_k$ of the binary vector c is set.

If not all bits of the binary vector c are set, the processors $P_1, \ldots, P_{num}$ count the number of leading ones in the binary vector c i.e., cntlo(c), the number of consecutive '1' bits from starting from the most-significant bit position in c, to determine each of the following: (1) the token $S_i$ up to which the uncompressed output sequence E has been completed, and (2) a processor last_writer (=i) assigned to the token. An upper end of an index range in the uncompressed output sequence E that the processor last_writer has written into represents a high watermark HWM up to which the uncompressed output sequence E has been written in its entirety.

The processors $P_1, \ldots, P_{num}$ utilize the broadcast primitive to instruct the processor last_writer to broadcast to all other processors of the processor set P a last position in the uncompressed output sequence E that the processor last_writer wrote to. For each processor $P_k$ assigned a dependent back-reference token that has not yet been written into the uncompressed output sequence E (i.e., a corresponding flag $c_k$ is cleared), the processor $P_k$ may use the high watermark HWM to determine whether all elements in a corresponding source index range $[s_l, s_u]$ in the uncompressed output sequence E are available. If all elements are available, the processor $P_k$ may copy a subsequence (i.e., substring) from the source index range $[s_l, s_u]$ and write the copied subsequence into a corresponding destination index range $[d_l, d_u]$ in the uncompressed output sequence E. As the high watermark HWM jumps forward, potentially more than one processor may write its assigned back-reference tokens to resolve. The parallel resolution of dependent back-reference tokens occurs using a monotonically increasing high watermark.

Figure 6:
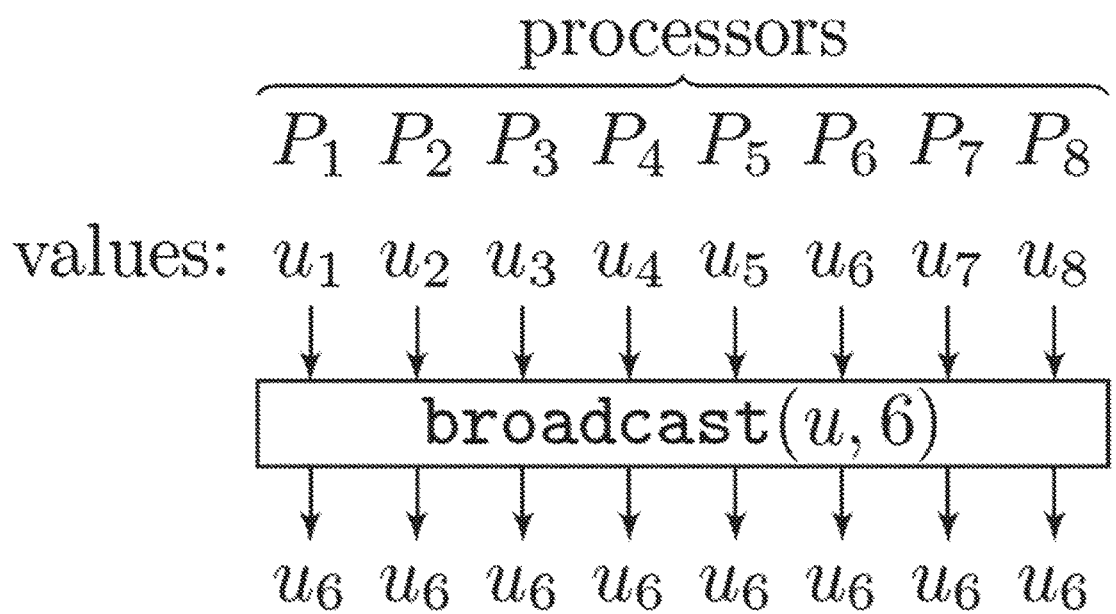
FIG. 6 illustrates an example processor set utilizing a broadcast primitive, in accordance with an embodiment of the invention.

FIG. 6 illustrates an example set P of processors utilizing a broadcast primitive, in accordance with an embodiment of the invention. For a data block, assume $P_{num}=8$, such that the data block is assigned processors $P_1, \ldots, P_8$. Each of the processors $P_k$ provide to arguments, $u_k$ and an index $i_k$ (in FIG. 6. for example, all processors provide the same index value 6). The purpose of the broadcast primitive is, like the ballot primitive in [0066], twofold. First, it also acts as a barrier. Second, the shuffles the supplied values. Specifically, if processor $P_k$ supplied index i, it will receive the value $u_i$, i.e., the value supplied by processor $P_i$, as a result of the broadcast operation. In FIG. 6, since all processors specify index value 6, they will obtain the value $u_6$ provided by processor $P_6$.

Figure 7:
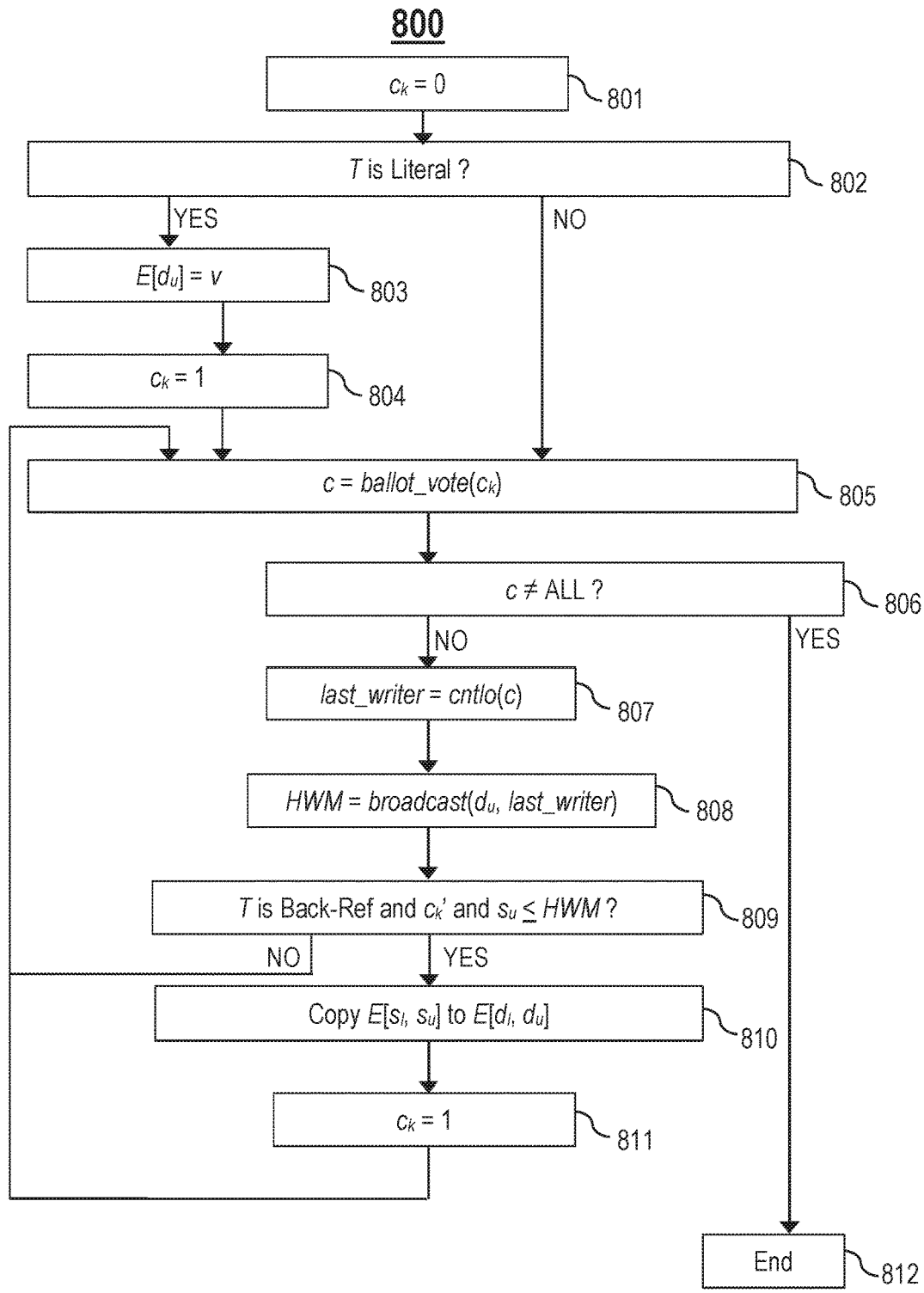
FIG. 7 illustrates a flowchart of an example process 800 for parallel resolution of dependent back-reference tokens, in accordance with an embodiment of the invention.

FIG. 7 illustrates a flowchart of an example process 900 for parallel resolution of dependent back-reference tokens, in accordance with an embodiment of the invention. In process block 801, for each processor $P_k$, clear each corresponding flag $c_k$ (i.e., $c_k=0$). In process block 802, determine whether an assigned token T for the processor $P_k$ is a literal token. If the assigned token T is not a literal token, proceed to process block 805. If the assigned token T is a literal token, proceed to process block 803.

In process block 803, write a corresponding literal value v for the literal token into an uncompressed output sequence E at a start position $d_u$ (i.e., $E[d_u]=v$). The start position was determined in F', as previously described. In process block 804, set the corresponding flag $c_k$ to indicate that the processor $P_k$ has completed writing the assigned token T into the uncompressed output sequence E (i.e., $c_k=1$).

In process block 805, set c=ballot_vote($c_k$). In process block 806, determine whether all processors have completed writing an assigned token into the uncompressed output sequence E (i.e., whether c≠ALL). If all processors have completed writing an assigned token into the uncompressed output sequence E, proceed to process block 812 where the process 800 ends. If not all processors have completed writing an assigned token into the uncompressed output sequence E, proceed to process block 807.

In process block 807, the number of leading ones in c are counted to determine a token $S_a$ up to which the uncompressed output sequence E has been completed and a processor last_writer assigned to the token $S_a$ (i.e., last_writer=cntlo(c)). In process block 808, set a high watermark HWM to an upper end of an index range in the uncompressed output sequence E that the processor last_writer has written into (i.e., HWM=broadcast($d_u$, last_writer)). This step informs all participating processors what a current HWM in the uncompressed output sequence E is (i.e., up to which position the uncompressed output sequence E has been written in its entirety). In process block 809, determine whether the token T is a back-reference token and $c_k'$ and $s_u \le HWM$. If the token T is a back-reference token and $c_k'$ and $s_u \le HWM$, proceed to process block 810; otherwise, return to process block 805.

In process block 810, copy a subsequence (i.e., substring) from a source index range $[s_l, s_u]$ in the uncompressed output sequence E, and write the copied subsequence into a destination index range $[d_l, d_u]$ in the uncompressed output sequence E. In process block 811, set the corresponding flag $c_k$ to indicate that the processor last_writer has completed writing the assigned token T into the uncompressed output sequence E (i.e., $c_k=1$), and return to process block 805.

In one embodiment, process blocks 801-812 may be performed by the compression system 110 utilizing a processor set 100.

Figure 8:
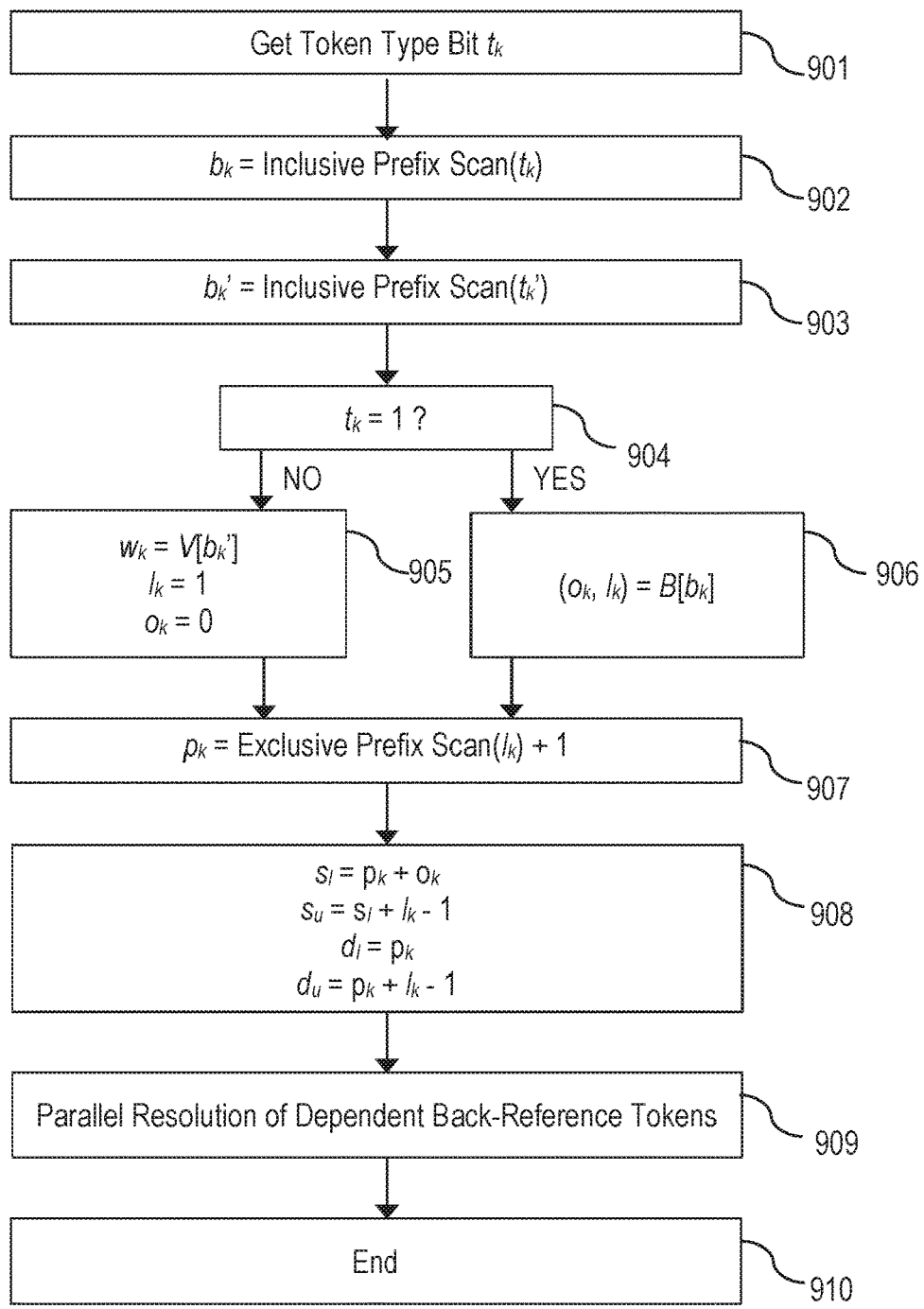
FIG. 8 illustrates a flowchart of an example process 900 for parallel decompression, in accordance with an embodiment of the invention.

FIG. 8 illustrates a flowchart of an example process 900 for parallel decompression, in accordance with an embodiment of the invention. In process block 901, for each processor $P_k$, determine a token type for an assigned token (i.e., whether a literal token or a back-reference token) based on a corresponding bit $t_k$. In process block 902, compute a first inclusive prefix scan using corresponding bits $t_k$ of all processors. The first inclusive prefix scan is a cooperative effort that involves all processors with their corresponding bits $t_k$. In process block 903, compute a second inclusive prefix scan using a corresponding negated bit $t_k'$ of all processors. The second inclusive prefix scan is a cooperative effort that involves all processors with their corresponding bits $t_k'$. In process block 904, for each processor $P_k$, determine whether a corresponding bit $t_k$ is set to 1 to determine whether a token type for an assigned token is a literal token. If the token type for the assigned token is a literal token (i.e., $t_k \neq 1$), proceed to process block 905. If the token type for the assigned token is a back-reference token (i.e., $t_k=1$), proceed to process block 906.

In process block 905, determine a corresponding literal value and a corresponding start position for the literal token. In process block 906, determine a corresponding offset and a corresponding start position for the back-reference token.

In process block 907, compute an exclusive prefix scan that excludes a corresponding length value $l_k$ for the assigned token, and increment a resulting exclusive prefix sum.

In process block 908, determine a corresponding source index range $[s_l, s_u]$ and a corresponding destination index range $[d_l, d_u]$.

In process block 909, call a routine for parallel resolution of dependent back-reference tokens (e.g., example process 800).

In process block 910, the example process 900 ends.

In one embodiment, process blocks 901-910 may be performed by the compression system 110 utilizing a processor set.

Figure 9:
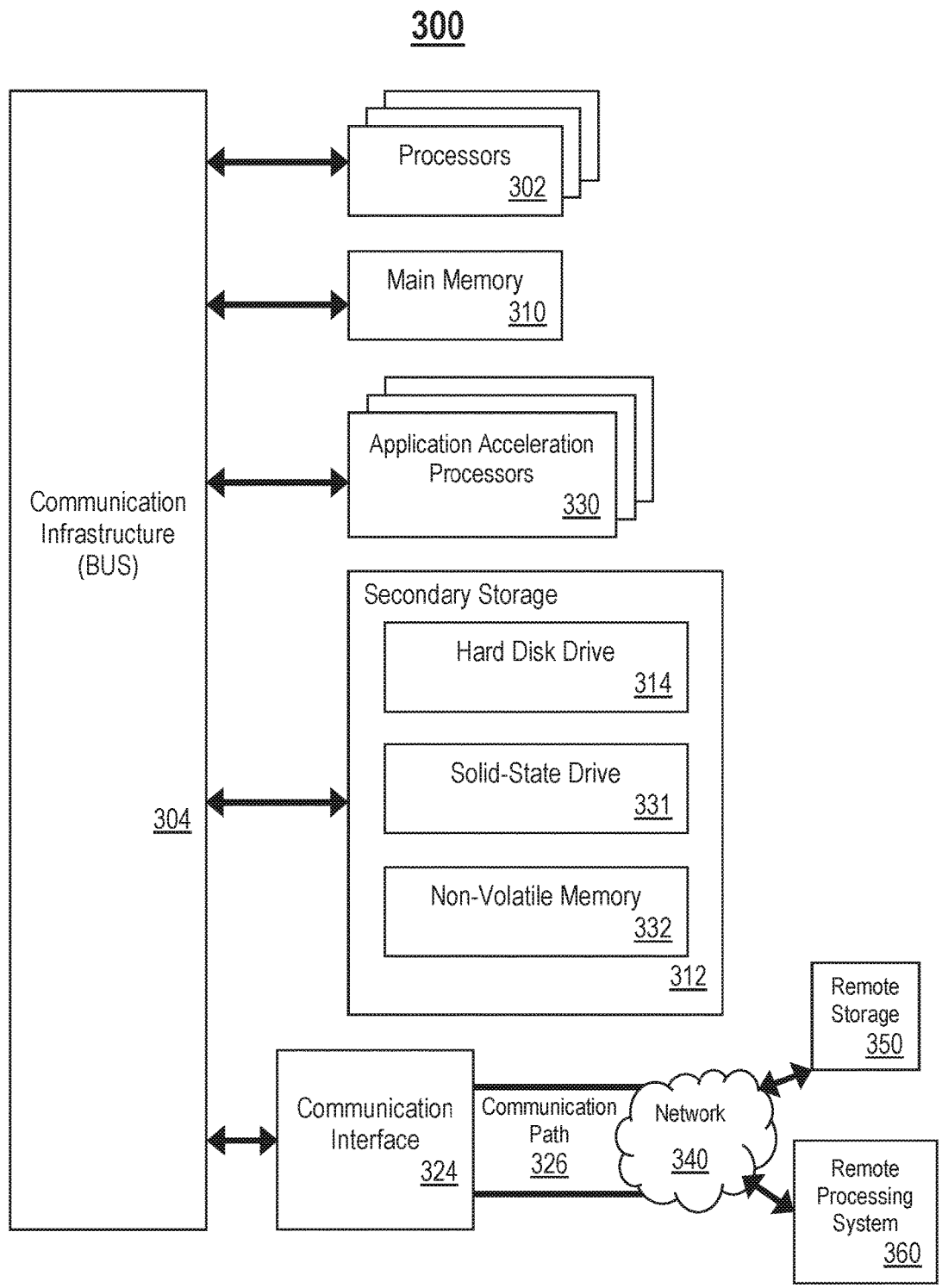
FIG. 9 is a high level block diagram showing an information processing system useful for implementing an embodiment of the present invention.

FIG. 9 is a high level block diagram showing an information processing system 300 useful for implementing one embodiment of the invention. The computer system includes a set of processors 302. Each processor 302 is connected to a communication infrastructure 304 (e.g., a communications bus, cross-over bar, or network).

The computer system may also include a set of specialized processor devices, such as application acceleration processors 330 (e.g., GPUs, FPGAs, etc.). Each application acceleration processor 330 is connected to a communication infrastructure 304 (e.g., a communications bus, cross-over bar, or network).

The computer system also includes a main memory 310, preferably random access memory (RAM), and may also include a secondary storage 312. The secondary storage 312 may include, for example, a hard disk drive 314, a solid-state drive 331, and/or a non-volatile memory 332. In alternative embodiments, the secondary storage 312 may include other similar means for allowing computer programs or other instructions to be loaded into the computer system.

The computer system may also include a communication interface 324. Communication interface 324 allows software and data to be transferred between the computer system and external devices via a network 340, such as a remote storage device 350, a remote processing system 360, etc. Examples of communication interface 324 may include a modem, a network interface (such as an Ethernet card), a communication port, etc. Software and data transferred via communication interface 324 are in the form of signals which may be, for example, electronic, electromagnetic, optical, or other signals capable of being received by communication interface 324. These signals are provided to communication interface 324 via a communication path (i.e., channel) 326. This communication path 326 carries signals and may be implemented using wire or cable, fiber optics, a phone line, a cellular phone link, an RF link, and/or other communication channels.

The present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

From the above description, it can be seen that the present invention provides a system, computer program product, and method for implementing the embodiments of the invention. The present invention further provides a non-transitory computer-useable storage medium for implementing the embodiments of the invention. The non-transitory computer-useable storage medium has a computer-readable program, wherein the program upon being processed on a computer causes the computer to implement the steps of the present invention according to the embodiments described herein. References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   receiving a plurality of encoded and compressed data blocks;
   decoding the data blocks;
   decompressing the data blocks utilizing a plurality of processor sets, wherein each processor set is assigned a data block to decompress, the processor sets decompress in parallel to exploit inter-block parallelism, each processor set comprises one or more processors that collaborate in decompressing an assigned data block to exploit intra-block parallelism, each processor of each processor set is assigned a token from a sequence of decoded tokens factorized from an assigned data block, and each processor of each processor set processes an assigned token based a token type of the assigned token; and
   generating a final uncompressed output sequence based on uncompressed data blocks resulting from the decompressing.

2. The method of claim 1, wherein the decompressing comprises:

for each processor set:
maintaining a corresponding sequence of decoded tokens factorized from an assigned data block, wherein each processor of the processor set is assigned a token from the corresponding sequence of decoded tokens;
maintaining a corresponding literal tokens list comprising each literal token of a corresponding sequence of decoded tokens;
maintaining a corresponding back-reference tokens list comprising each back-reference token of the corresponding sequence of decoded tokens; and
maintaining a corresponding back-reference bitmap comprising a sequence of bits, wherein each bit of the back-reference bitmap corresponds to a token of the corresponding sequence of decoded tokens and indicates a token type of the corresponding token.

3. The method of claim 2, wherein the decompressing comprises:

for each processor of each processor set:
determining a token type of an assigned token based on a bit of a corresponding back-reference bitmap, wherein the token type is one of a literal token or a back-reference token.

4. The method of claim 3, wherein the decompressing comprises:

for each processor set:
utilizing each processor of the processor set to collectively negate bits of a corresponding back-reference bitmap to create a corresponding negated back-reference bitmap.

5. The method of claim 4, wherein the decompressing comprises:

for each processor set:
utilizing each processor of the processor set to collectively compute a corresponding first inclusive prefix scan and a corresponding second inclusive prefix scan based on bits of a corresponding back-reference bitmap and bits of a corresponding negated back-reference bitmap, respectively.

6. The method of claim 5, wherein the decompressing comprises:

for each processor assigned a literal token of each processor set:
utilizing a prefix sum of a corresponding second inclusive prefix scan as an index into a corresponding literal tokens list to retrieve a literal value for the literal token.

7. The method of claim 5, wherein the decompressing comprises:

for each processor assigned a back-reference token of each processor set:
utilizing a prefix sum of a corresponding first inclusive prefix scan as an index into a corresponding back-reference tokens list to retrieve the back-reference token.

8. The method of claim 5, wherein the decompressing comprises:

for each processor set:
determining a token lengths list comprising a list of length values, wherein each length value corresponds to a token of a corresponding sequence of decoded tokens; and
utilizing each processor of the processor set to collectively compute a corresponding exclusive prefix scan, wherein each prefix sum of the corresponding exclusive prefix scan corresponds to a token of a corresponding sequence of decoded tokens, the prefix sum is exclusive of a length value of the corresponding token, and the prefix sum indicates a start position for the corresponding token in a corresponding uncompressed output sequence for an assigned data block.

9. The method of claim 8, wherein the decompressing comprises:

for each processor assigned a literal token of each processor set:
determining a corresponding start position for the literal token in a corresponding uncompressed output sequence; and
writing a literal value for the literal token into the corresponding uncompressed output sequence at the corresponding start position.

10. The method of claim 8, wherein the decompressing comprises:

for each processor assigned a back-reference token of each processor set:
determining a corresponding source index range and a corresponding destination index range for the back-reference token in a corresponding uncompressed output sequence;
copying a sub string from the corresponding source index range in the uncompressed output sequence; and
writing the substring into the corresponding destination index range in the uncompressed output sequence.

11. The method of claim 10, wherein the decompressing comprises:

parallel resolution of a dependent back-reference token utilizing a ballot voting primitive and a broadcast primitive.

12. A system comprising:

at least one processor; and
a non-transitory processor-readable memory device storing instructions that when executed by the at least one processor causes the at least one processor to perform operations including:
receiving a plurality of encoded and compressed data blocks;
decoding the data blocks;
decompressing the data blocks utilizing a plurality of processor sets, wherein each processor set is assigned a data block to decompress, the processor sets decompress in parallel to exploit inter-block parallelism, each processor set comprises one or more processors that collaborate in decompressing an assigned data block to exploit intra-block parallelism, each processor of each processor set is assigned a token from a sequence of decoded tokens factorized from an assigned data block, and each processor of each processor set processes an assigned token based a token type of the assigned token; and
generating a final uncompressed output sequence based on uncompressed data blocks resulting from the decompressing.

13. The system of claim 12, wherein the decompressing comprises:

for each processor set:
maintaining a corresponding sequence of decoded tokens factorized from an assigned data block, wherein each processor of the processor set is assigned a token from the corresponding sequence of decoded tokens;

maintaining a corresponding literal tokens list comprising each literal token of a corresponding sequence of decoded tokens;

maintaining a corresponding back-reference tokens list comprising each back-reference token of the corresponding sequence of decoded tokens; and maintaining a corresponding back-reference bitmap comprising a sequence of bits, wherein each bit of the back-reference bitmap corresponds to a token of the corresponding sequence of decoded tokens and indicates a token type of the corresponding token.

14. The system of claim 13, wherein the decompressing comprises:

for each processor of each processor set:
determining a token type of an assigned token based on a bit of a corresponding back-reference bitmap, wherein the token type is one of a literal token or a back-reference token.

15. The system of claim 14, wherein the decompressing comprises:

for each processor set:
utilizing each processor of the processor set to collectively negate bits of a corresponding back-reference bitmap to create a corresponding negated back-reference bitmap.

16. The system of claim 15, wherein the decompressing comprises:

for each processor set:
utilizing each processor of the processor set to collectively compute a corresponding first inclusive prefix scan and a corresponding second inclusive prefix scan based on bits of a corresponding back-reference bitmap and bits of a corresponding negated back-reference bitmap, respectively.

17. The system of claim 16, wherein the decompressing comprises:

for each processor assigned a literal token of each processor set:
utilizing a prefix sum of a corresponding second inclusive prefix scan as an index into a corresponding literal tokens list to retrieve a literal value for the literal token; and for each processor assigned a back-reference token of each processor set:
utilizing a prefix sum of a corresponding first inclusive prefix scan as an index into a corresponding back-reference tokens list to retrieve the back-reference token.

18. The system of claim 16, wherein the decompressing comprises:

for each processor set:
determining a token lengths list comprising a list of length values, wherein each length value corresponds to a token of a corresponding sequence of decoded tokens; and utilizing each processor of the processor set to collectively compute a corresponding exclusive prefix scan, wherein each prefix sum of the corresponding exclusive prefix scan corresponds to a token of a corresponding sequence of decoded tokens, the prefix sum is exclusive of a length value of the corresponding token, and the prefix sum indicates a start position for the corresponding token in a corresponding uncompressed output sequence for an assigned data block.

19. The system of claim 18, wherein the decompressing comprises:

for each processor assigned a literal token of each processor set:
determining a corresponding start position for the literal token in a corresponding uncompressed output sequence; and writing a literal value for the literal token into the corresponding uncompressed output sequence at the corresponding start position; and for each processor assigned a back-reference token of each processor set:
determining a corresponding source index range and a corresponding destination index range for the back-reference token in a corresponding uncompressed output sequence;

copying a substring from the corresponding source index range in the uncompressed output sequence; and writing the substring into the corresponding destination index range in the uncompressed output sequence.

20. A computer program product comprising a computer-readable hardware storage medium having program code embodied therewith, the program code being executable by a computer to implement a method comprising:

receiving a plurality of encoded and compressed data blocks;

decoding the data blocks;

decompressing the data blocks utilizing a plurality of processor sets, wherein each processor set is assigned a data block to decompress, the processor sets decompress in parallel to exploit inter-block parallelism, each processor set comprises one or more processors that collaborate in decompressing an assigned data block to exploit intra-block parallelism, each processor of each processor set is assigned a token from a sequence of decoded tokens factorized from an assigned data block, and each processor of each processor set processes an assigned token based a token type of the assigned token; and generating a final uncompressed output sequence based on uncompressed data blocks resulting from the decompressing.

* * * * *